WATER VAPOR CONTROL IN VAPOR-SOLID DIFFUSION OF BORON

Filed Feb. 23, 1967

INVENTORS.
HUGH M. BOHNE
CECIL B. SHELTON
BY Arthur L. Lessler
ATTORNEY

United States Patent Office 3,484,314
Patented Dec. 16, 1969

3,484,314
WATER VAPOR CONTROL IN VAPOR-SOLID DIFFUSION OF BORON

Hugh Bohne, Lake Worth, and Cecil B. Shelton, North Palm Beach, Fla., assignors to International Telephone and Telegraph Corporation, a corporation of Delaware
Filed Feb. 23, 1967, Ser. No. 618,155
Int. Cl. H01l 7/44
U.S. Cl. 148—188 8 Claims

ABSTRACT OF THE DISCLOSURE

An improvement in the vapor-solid diffusion process of providing a boron impurity distribution in silicon. The conventional process employs a boron compound such as, e.g., boron tribromide to react with oxygen so as to form a borosilicate glaze on the surface of the silicon body into which the boron is to be diffused. The slice is subsequently heated to diffuse boron from the glaze into the silicon body. The improvement involves the use of a solution of water vapor and a volatile ingredient having a relatively high vapor pressure to introduce an accurately controllable concentration of water vapor to react any free boron formed by disassociation of the gaseous boron compound. This reaction prevents the boron from reacting with silicon to produce objectionable silicon-boron compounds.

BACKGROUND OF THE INVENTION

Figures 1, 2:
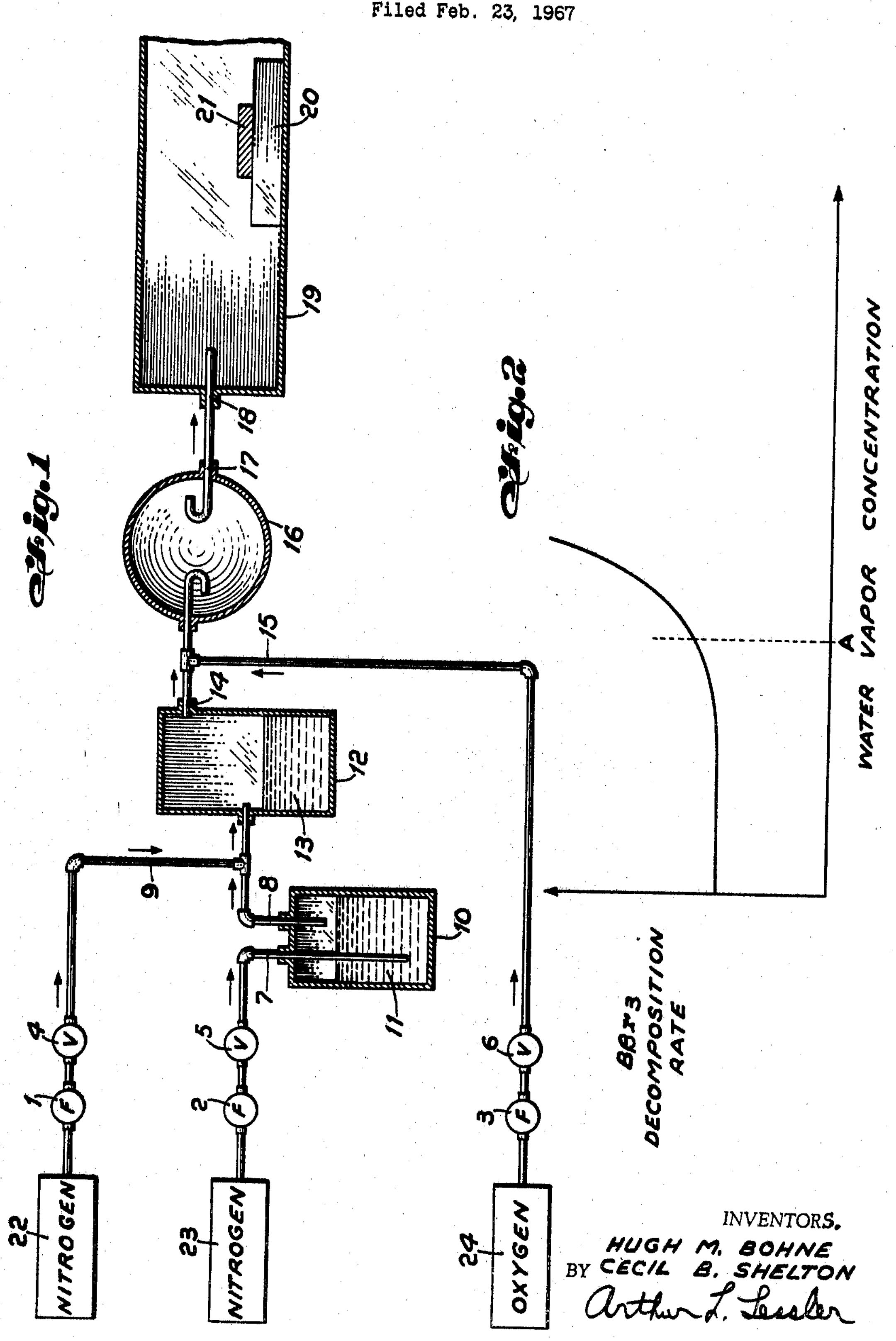

This invention relates to techniques for improving vapor-solid diffusion processes in which boron is employed as the conductivity-type-determining impurity material, and more particularly to a method for introducing an accurately controllable concentration of water vapor to prevent the formation of objectionable compounds of boron during the practice of such a process.

Techniques for varying the conductivity and/or conductivity type of a silicon semiconductor body by diffusion of a suitable impurity into said body are well known in the art. In particular, vapor-solid diffusion techniques have gained wide acceptance for the production of relatively high surface impurity concentrations; good uniformity and reproducibility of such concentrations has been realized by the use of such techniques. Generally, vapor-solid diffusion involves the deposition of a dopant-containing glass on the surface of the silicon body to be processed. The glass contains trapped impurity atoms which are diffused into the semiconductor surface during a subsequent heat treatment step.

Where the use of a P type impurity for doping a silicon semiconductor body is desired and a high impurity concentration at the silicon surface is required, boron is generally used as the impurity element. At the high temperatures required for the formation of the borosilicate glaze which serves as the impurity source during the subsequent diffusion "drive-in" step, the boron tends to react directly with the silicon to produce silicon-boron compounds which stain the slice surface and are difficult to remove. In particular, boron hexa-silicide is a commonly formed compound of this type. This compound seems to be insoluble in any solvent that will not dissolve silicon, and so must generally be removed by mechanical methods. Any such mechanical methods, such as lapping, result in removal of a surface layer of the silicon, thus raising the minimum sheet resistivity obtainable by such a vapor-solid diffusion technique.

Accordingly, an object of the present invention is to provide an improved process for the vapor-solid diffusion of boron in silicon.

Another object of the invention is to prevent the formation of undesirable silicon-boron compounds during such a vapor-solid diffusion process by introducing an accurately controlled amount of water vapor to react with any free boron present.

SUMMARY

The present invention provides an improved process for the vapor-solid diffusion of boron in silicon by introducing a controlled amount of water vapor into the reaction chamber to react with any free boron present thereby removing such boron from the reaction and preventing the formation of undesired boron-silicon compounds. The water vapor concentration is accurately controlled by deriving the water vapor from a solution comprising water and a volatile ingredient having a vapor perssure substantially greater than the vapor pressure of water at the temperature at which the solution is maintained.

THE DRAWING

FIG. 1 shows a flow diagram of apparatus employed in practicing the novel process of the invention; and FIG. 2 shows a graph useful in understanding the invention.

DETAILED DESCRIPTION

In cases where a high concentration of acceptor impurities is desired in a silicon semiconductor body, i.e. where it is desired to form a region in the body having P+ type conductivity, boron is commonly used as the active impurity material. Generally a gaseous compound of boron, preferably a boron halide or a boron hydride such as diborane, is mixed with oxygen or another oxygen-containing compound and passed over the surface of the silicon slice to be processed. The silicon slice is maintained at a temperature sufficiently high to cause reaction of the gaseous components to produce a borosilicate glaze ($SiO_2 \cdot B_2O_3$) on the silicon surface having a high but accurately controlled solid solubility of boron in silicon, generally on the order of $10^{20}$ atoms of boron per $cm.^3$ of borosilicate glaze. The glaze coated silicon slice is subsequently heated at an elevated temperature, generally on the order of 1250° C. to "drive-in" boron atoms from the borosilicate glaze into the silicon body to obtain the desired impurity concentration and distribution.

In practicing such a vapor-solid diffusion process, it has been found that staining of the silicon slice occurs during the deposition of the borosilicate glaze. The stains so formed are very difficult to remove and interfere with the formation of metallic contacts to the semiconductor body after the diffusion step has been completed. These stains have been found to include a reaction product of boron and silicon, typically boron hexa-silicide, as well as other undesirable reaction products due to other substances present during the glaze deposition process.

For the sake of specificity the following discussion will be directed to the utilization of boron tribromide as the gaseous boron compound used to form the borosilicate glaze. However, it should be kept in mind that similar effects occur with other halides of boron as well as with boron hydrides such as diborane, and that the invention is applicable to processes utilizing these boron compounds as well as those processes which employ boron tribromide.

In utilizing boron tribromide for the dopant source in the vapor-solid diffusion process, nitrogen is first saturated with boron tribromide by bubbling the nitrogen through a liquid solution of the boron tribromide. The saturated nitrogen is mixed with oxygen and introduced into the hot zone of the deposition furnace. The temperature of the silicon slice in the furnace is maintained sufficiently high to cause dissociation of the boron tribromide gas and subsequent reaction at the silicon surface in the presence of the oxygen to produce the desired borosilicate glaze deposit. The borosilicate glaze traps and holds boron carriers thus providing an accurately controlled surface impurity concentration for the subsequent diffusion step which comprises heating the silicon slice at a sufficiently high temperature and for a sufficiently long time to diffuse the trapped boron carriers from the glaze into the silicon body to the desired extent.

The primary reactions involved in formation of the borosiilcate glaze are as follows:

$$4BBr_3+3O_2 \rightarrow 6Br_2+B_2O_3 \quad (1)$$

$$B_2O_3+Si+O_2 \rightarrow B_2O_3 \cdot SiO_2 \quad (2)$$

Equations 1 and 2 depict the ideal situation for borosilicate glaze formation. Unfortunately, however, boron tribromide has a tendency to dissociate thus liberating free boron and free bromine. The bromine and boron compounds each can react with the silicon to produce undesired precipitates which stain the slice surface. Reactions which may be involved are set forth in Equations 3–5 below:

$$2BBr_3 \rightarrow 2B+3Br_2 \quad (3)$$

$$6B+Si \rightarrow SiB_6 \quad (4)$$

$$2Br_2+Si \rightarrow SiBr_4 \quad (5)$$

The staining effects occur primarily at slice surface temperatures above 1090° C. The stains produce dark brown, black and gold-brown hues across the exposed silicon surface in addition to a rich blue hue attributed to the borosilicate glaze. Comparing these stains with the physical characteristics of the reactants, boron hexasilicate has a black color characteristic while bromine has a gold-brown color characteristic. Accordingly, it is apparent that both silicon-boron and silicon-bromine compounds are probably formed by the reaction of the dissociation constituents of the boron tribromide gas with the silicon surface.

Another stain produced when the concentration of free boron is high is the result of a reaction with oxygen to produce a suboxide of boron, believed to be $B_6O$ or $B_7O$. This suboxide causes a "brown skin" formation on the silicon surface.

It has been found that the introduction of water vapor into the gas mixture of boron tribromide and oxygen in the proper quantity serves to substantially reduce or eliminate the aforementioned staining effects. Since the boron tribromide tends to decompose more rapidly in the presence of water vapor, it is important that the water vapor concentration be maintained sufficiently low to prevent excessive boron tribromide dissociation. The water vapor is believed to react with the boron tribromide and the boron and bromine constituents produced by dissociation thereof according to Equations 6–8, although additional side reactions are probably involved:

$$BBr_3+3H_2O \rightarrow H_3BO_3+3HBr \quad (6)$$

$$2B+3H_2O \rightarrow 2H_3BO_3 \quad (7a)$$

$$2B+H_2O \rightarrow B_2O_3+3H_2 \quad (7b)$$

$$2B_2O_3+H_2O \rightarrow H_2B_4O_7 \quad (7c)$$

$$H_2B_4O_7+5H_2O \rightarrow 4H_3BO_3 \quad (7d)$$

$$2Br_2+2H_2O \rightarrow 4HBr+O_2 \quad (8)$$

Equation 6 is the expression for the increased decomposition of boron tribromide in the presence of water vapor. FIG. 2 shows a plot of the boron tribromide decomposition rate as a function of the water vapor concentration. It is seen that beyond a critical water vapor concentration denoted as A, the boron tribromide decomposition rate increases rapidly with relatively small increases in water vapor concentration. This critical concentration has been experimentally determined to be on the order of 2000 parts of water vapor for each one million parts of boron tribromide gas.

Equations 7 and 8 indicate the manner in which the water vapor reacts any free boron and bromine to produce relatively stable compounds which remove the boron and bromine from the reaction to preclude the formation of undesirable boron-silicon, bromine-silicon and boron suboxide compounds which would otherwise precipitate onto the silicon surface to produce stains difficult to remove.

It will be appreciated that the amount of water vapor required ot preclude the formation of stains is quite critical, since too low a water vapor concenrtation will not react all the free boron and free bromine. Too high a water vapor concentration, however, will greatly increase the decomposition rate of the boron tribromide, in accordance with Equation 6 and the graph of FIG. 2, and will not permit the formation of a borosilicate glaze which contains a sufficiently high solid solubility level of trapped boron impurities. Thus an excessive water vapor concentration will substantially reduce or eliminate the doping capability of the boron tribromide as a conductivity-type-determining impurity source.

The criticality of the water vapor concentration has been verified experimentally under conditions which will hereinafter be described. Under such conditions we have observed that water vapor concentrations substantially less than two thousand parts per million parts of boron tribromide result in the production of the aforementioned stains on the silicon slice. As the water vapor concentration is increased, the stains decrease and are substantially eliminated at the critical value of two thousand parts per million. When the water vapor concentration is increased further, the sheet resistivity of the resultant diffused silicon surface increases, indicating that so much boron tribromide has been removed from the reaction by the water vapor that an insufficient quantity of boron impurities has been deposited in the borosilicate glaze, thus failing to provide a sufficiently high concentration of these impurities to (upon diffusion into the silicon surface) reduce the bulk resistivity of the silicon to the desired low value.

It is therefore evident that staining in the vapor-solid diffusion process where boron tribromide is employed as the dopant source can be greatly reduced by introduction of a critically controlled amount of water vapor. We have discovered that this critically controlled and relatively small water vapor concentration can be accurately introduced into the gas stream by utilizing a solution comprising water vapor and a volatile ingredient having a vapor pressure substantially greater than that of water at the temperature at which the liquid solution is maintained. Specifically, we prefer to employ ammonium hydroxide, a solution of ammonia ($NH_3$) in water, as the water vapor source; upon evaporation, the ammonium hydroxide dissociates into ammonia and water vapor. The ammonia has a vapor pressure at room temperature which is far greater than the vapor pressure of water at room temperature. Moreover, over the room temperature range of approximately 70–90° F., the vapor pressure of water varies over a range of greater than 2:1 (from .024 p.s.i.a. at 70° F. to .047 p.s.i.a. at 90° F.), while the vapor pressure of the ammonia varies over a relatively small range corresponding to the room temperature range of 70–90° F. As a result, the water vapor concentration in the case where the water vapor is obtained by passing a carrier gas over the saturated vapor of ammonia and water resulting from evaporation of the ammonium hydroxide at room temperature varies over a relatively small percentage range corresponding to the room temperature varition of 70–90° F. For example, we have observed that an ammonium hydroxide concentration which produces a water vapor concentration of 1500 parts per million parts of boron tribromide at an ammonium hydroxide liquid temperature of 70° F., produces a water vapor concentration of about 1800 parts per million under the same conditions at an ammonium hydroxide liquid temperature of 90° F. Thus the water vapor concentration varies no more than 20% over the ambient temperature range, whereas if water alone was used as the water vapor source the resultant water vapor concentration would vary over a range of more than 100% corresponding to the same temperature range.

FIG. 1 shows a flow diagram for particular apparatus which may be employed in practicing a preferred embodiment of the invention. It should be understood, however, that applicants' invention is directed to a novel process for reducing staining in the vapor-solid diffusion of boron, and that other apparatus which will be evident to those skilled in the art may be employed in the practice of our process.

FIG. 1 includes sources of nitrogen carrier gas 22 and 23. Although nitrogen is utilized as the carrier gas and is relatively inert at the temperatures which are utilized in the preferred embodiment hereinafter described, where higher temperatures are employed it may be desirable to utilize a more inert gas such as argon in order to prevent the formation of undesirable nitrogen compounds. Also provided is a source of oxygen gas 24. The gaseous sources 22 and 23 should preferably have an extremely low residual water vapor concentration not exceeding a value on the order of 5 parts per million, in order that the water vapor introduced into the gas stream may be obtained only from the controlled source comprising the vessel 12 and the liquid 13 contained therein.

Flow meters 1, 2 and 3 as well as control valves 4, 5 and 6 are inserted in series with the gas sources 22, 23 and 24 respectively. A container 10 holds a liquid 11 comprising boron tribromide through which the nitrogen carrier gas from the source 23 is bubbled. This carrier gas enters the liquid boron tribromide 11 by means of a conduit 7 and emerges therefrom by means of a conduit 8. The conduit 8 therefore contains a saturated mixture of boron tribromide in nitrogen. In our preferred embodiment the flow rate of the nitrogen source 23 as measured by the flow meter 2 is preferably 4 cc. per minute, and the boron tribromide liquid 11 is maintained at room temperature (approximately 70–90° F.) A second source of nitrogen carrier gas 22 enters through a conduit 9 and combines with the boron tribromide-saturated nitrogen gas from the conduit 8. The thus diluted boron tribromide vapor passes into the container 12 and leaves said container through a conduit 14. The container 12 is maintained at room temperature (approximately 70–90° F.) and contains a 30% molarity solution of ammonium hydroxide. The resultant ammonia and water vapors fill the area of the container 12 in communication with the liquid ammonium hydroxide 13. These vapors are picked up by the boron tribromide-nitrogen mixture which passes over the surface of the liquid 13, and the combined gases are passed out of the container 12 by means of the conduit 14. A conduit 15 merges with the conduit 14 to add dry oxygen gas to the boron tribromide-water vapor-nitrogen-ammonia composition. The flow rates of the nitrogen gas source 22 and the oxygen gas source 24 are 2 liters per minute and 20 cc. per minute respectively in accordance with our preferred embodiment. The resultant mixture of the constituent gases (now comprising nitrogen, boron tribromide, ammonia, water vapor and oxygen) enters the mixer 16 which produces turbulence mixing of the constituent gases. The mixed gases leave the mixer 16 by means of a conduit 17 and enter the reaction chamber 19 through an aperture 18 therein.

Disposed in the reaction chamber 19 is a silicon slice 21 situated on a support 20. The support 20 and slice 21 are maintained at a temperature of 1165° C., and the constituent gases enter the reaction chamber 19 through the conduit 17 and aperture 18 at atmospheric pressure. The entering gases then react in the hot region adjacent the surface of the silicon slice 21 to deposit a borosilicate glaze containing a relatively high concentration of trapped boron impurities. With the aforementioned process parameters, the borosilicate glaze is observed to have a rich blue hue and a negligible surface deposit of nonremovable, objectionable stains.

After the borosilicate glaze has been formed by continuing the aforementioned deposition process for about 30 minutes, the silicon slice 21 is removed from the reaction chamber 19 and placed in a diffusion furnace maintained at a temperature of about 1250° C. for a period of time on the order of 2 to 6 hours, depending upon the desired final impurity concentration and distribution, to diffuse boron impurities from the borosilicate glaze into the surface of the silicon slice 21. After this diffusion step and subsequent removal of the borosilicate glaze, we have found that the silicon surface exhibits low sheet resistivity and good uniformity and reproducibility of sheet resistivity between silicon slices processed at different times. It is therefore evident that our process provides an accurately controllable and highly reproducible water concentration, while permitting a high impurity concentration to be reached in the diffused silicon surface.

It should be appreciated that the various concentrations and flow rates set forth in our preferred embodiment may be varied to obtain any desired resultant diffusion characteristic; for each combination of such parameters in critical water vapor concentration exists, and this critical value is best determined by empirical methods. Once the critical water vapor concentration has been determined, such a concentration may be accurately and reproducibly provided by the use of a liquid solution of water and a volatile ingredient having a relatively high vapor pressure, such as the ammonium hydroxide solution of our preferred embodiment.

While the principles of the invention have been described above in connection with specific embodiments, and particular modifications thereof, it is to be clearly understood that this description is made only by way of example and not as a limitation on the scope of the invention.

What we claim is:

1. In the process for diffusing boron into a given surface of a silicon semiconductor body according to the steps of:

passing a decomposable gaseous boron compound and an oxygen containing gaseous compound over said surface while maintaining said surface at a given temperature between 1090° C. and 1200° C. such that said compounds react to form a borosilicate glaze on said surface, said decomposable compound liberating free boron which at said temperature is capable of reacting with the silicon at said surface to form an undesired boron-silicon substance; and heating said body at a predetermined temperature above 1200° C. and for a sufficient time such that boron diffuses into said body from said borosilicate glaze, the improvement comprising the step of:

combining a controlled amount of water vapor with said compounds prior to said passing step, said amount being approximately between 1500 and 2000 parts of said water vapor for each one million parts of said boron compound and therefore sufficient to react said free boron to preclude the formation of said boron-silicon substance but not sufficient to neutralize the doping capability of said boron compound.

said combining step including exposing said gaseous boron compound to the vapors of a liquid comprising water and a volatile ingredient having a vapor pressure substantially greater than the vapor pressure of water at the temperature at which said liquid is maintained.

2. A process according to claim 1, wherein said boron compound is selected from the group consisting of a boron halide and diborane.

3. A process according to claim 2, wherein said boron compound is boron tribromide.

4. A process according to claim 1, wherein said liquid comprises ammonium hydroxide.

5. A process according to claim 1, wherein said gaseous boron compound comprises boron tribromide which is passed over the surface of said liquid, said liquid comprising ammonium hydroxide, and said amount of water vapor is sufficient to react free bromine liberated by decomposition of the boron tribromide to preclude formation of undesirable silicon-bromine compounds on said surface.

6. A process according to claim 3, wherein said controlled amount is on the order of 2000 parts of water vapor for each 1 million parts of boron tribromide.

7. A process according to claim 5, wherein said liquid is maintained at room temperature, said gaseous boron compound is obtained by bubbling a relatively inert carrier gas through a liquid solution comprising boron tribromide, and both said gaseous compounds contain not more than approximately five parts per million of water vapor by volume prior to said combining step.

8. A process according to claim 7, wherein said given temperature is on the order of 1165° C.

References Cited

UNITED STATES PATENTS

| | | | |
|---|---|---|---|
| 3,015,590 | 1/1962 | Fuller | 148—189 |
| 3,164,501 | 1/1965 | Beagle et al. | 148—189 |

L. DEWAYNE RUTLEDGE, Primary Examiner

R. A. LESTER, Assistant Examiner

U.S. Cl. X.R.

148—187, 189